(12) United States Patent
Tanikawa

(10) Patent No.: US 11,264,260 B2
(45) Date of Patent: Mar. 1, 2022

(54) CLEANING METHOD AND SUBSTRATE PROCESSING APPARATUS

(71) Applicant: TOKYO ELECTRON LIMITED, Tokyo (JP)

(72) Inventor: Takehiro Tanikawa, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/409,441

(22) Filed: May 10, 2019

(65) Prior Publication Data
US 2019/0348315 A1 Nov. 14, 2019

(30) Foreign Application Priority Data
May 14, 2018 (JP) .............................. JP2018-093308

(51) Int. Cl.
| | | |
|---|---|---|
| *H01L 21/683* | (2006.01) | |
| *H01L 21/687* | (2006.01) | |
| *H01L 21/67* | (2006.01) | |
| *B08B 5/02* | (2006.01) | |
| *B08B 6/00* | (2006.01) | |

(52) U.S. Cl.
CPC ............ *H01L 21/6831* (2013.01); *B08B 5/02* (2013.01); *B08B 6/00* (2013.01); *H01L 21/67017* (2013.01); *H01L 21/68735* (2013.01)

(58) Field of Classification Search
None
See application file for complete search history.

(56) References Cited

U.S. PATENT DOCUMENTS

| | | | | |
|---|---|---|---|---|
| 5,507,874 | A * | 4/1996 | Su .......................... | B08B 7/0035 134/1 |
| 6,475,336 | B1 * | 11/2002 | Hubacek ............. | C23C 16/4585 118/723 E |
| 2005/0189071 | A1 | 9/2005 | Moriya et al. | |
| 2015/0075566 | A1 * | 3/2015 | Tanikawa .......... | H01L 21/32137 134/22.1 |
| 2016/0211166 | A1 * | 7/2016 | Yan ........................ | H01J 37/023 |

FOREIGN PATENT DOCUMENTS

| | | | |
|---|---|---|---|
| JP | 2005-243915 A | 9/2005 | |
| KR | 20110080811 | * 7/2011 | ......... H01L 21/6833 |

OTHER PUBLICATIONS

KR20110080811 English Translation, accessed on Jun. 2021. (Year: 2011).*

* cited by examiner

*Primary Examiner* — Eric W Golightly
*Assistant Examiner* — Arlyn I Rivera-Cordero
(74) *Attorney, Agent, or Firm* — Weihrouch IP

(57) ABSTRACT

A method is for cleaning an edge ring. The edge ring includes an inner edge ring provided near a substrate mounted on an electrostatic chuck in a processing chamber, a central edge ring that is provided at an outer side of the inner edge ring and vertically movable by a moving mechanism, and an outer edge ring provided at an outer side of the central edge ring. The method includes applying a direct current voltage to the electrostatic chuck, and moving the central edge ring upward or downward.

11 Claims, 6 Drawing Sheets

CLEANING METHOD AND SUBSTRATE PROCESSING APPARATUS

CROSS-REFERENCE TO RELATED APPLICATIONS

This application claims priority to Japanese Patent Application No. 2018-093308, filed on May 14, 2018, the entire contents of which are incorporated herein by reference.

TECHNICAL FIELD

The present disclosure relates to a cleaning method and a substrate processing apparatus.

BACKGROUND

Conventionally, it has been proposed to generate convection by supplying a large amount of gas into a processing chamber and increasing pressure, peel off particles adhered to the inner surface of the processing chamber by the convection, and remove the peeled-off particles by viscous force of the gas (see, e.g., Japanese Patent Application Publication No. 2005-243915).

However, there are movable parts in the processing chamber, and it may be difficult to remove particles from the bottom surfaces of the movable parts or from the gap between the movable parts and non-movable parts.

The present disclosure provides a technique for removing particles from an edge ring and its neighboring components.

SUMMARY

In accordance with an aspect of the present disclosure, there is provided a method for cleaning an edge ring including an inner edge ring provided near a substrate mounted on an electrostatic chuck in a processing chamber, a central edge ring that is provided at an outer side of the inner edge ring and vertically movable by a moving mechanism, and an outer edge ring provided at an outer side of the central edge ring, including: applying a direct current voltage to the electrostatic chuck; and moving the central edge ring upward or downward.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
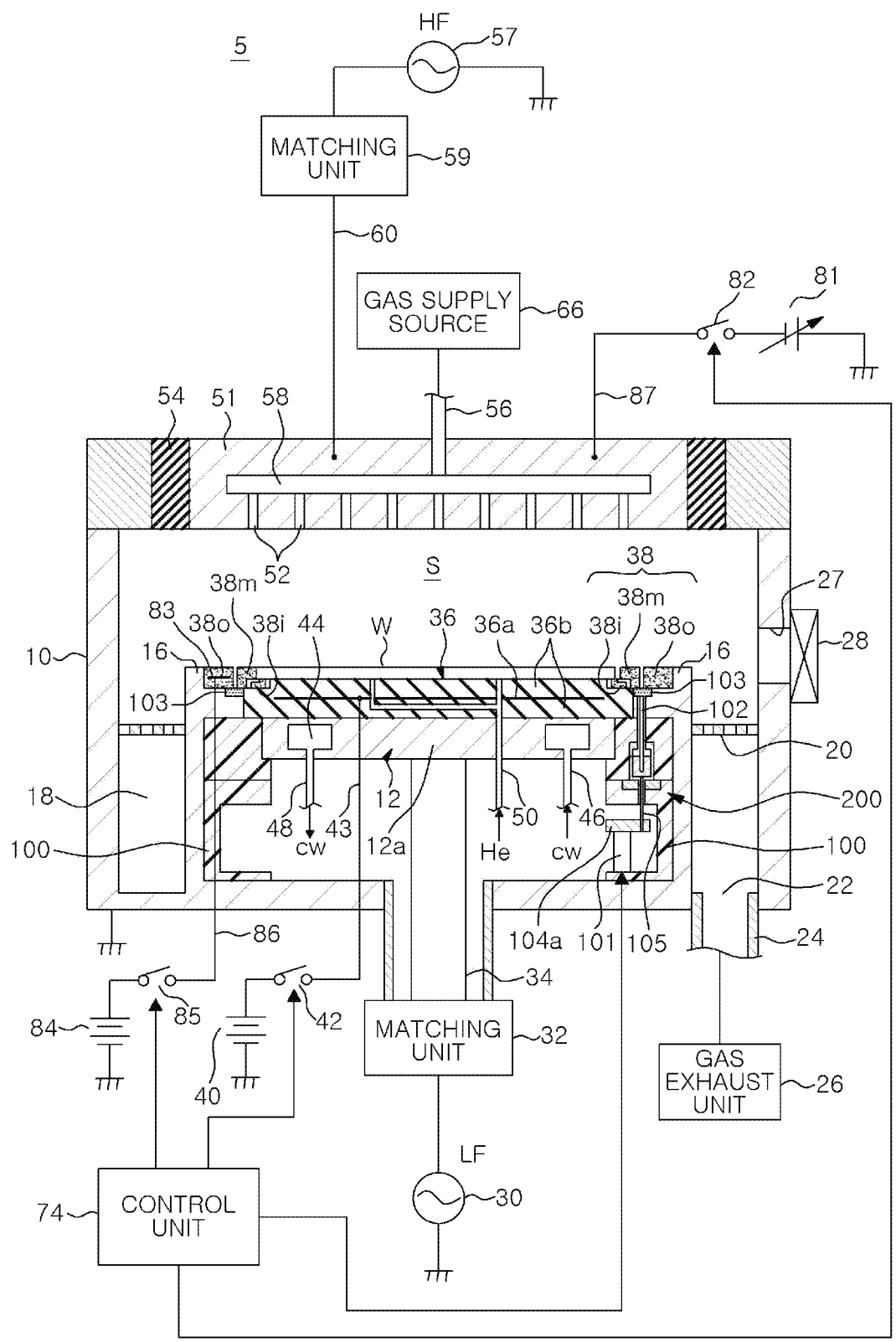
FIG. 1 is a longitudinal cross-sectional view showing an example of a substrate processing apparatus according to an embodiment.

Hereinafter, embodiments will be described in detail with reference to the accompanying drawings. Like reference numerals will be given to like or corresponding parts throughout the drawings, and redundant description thereof will be omitted.

(Substrate Processing Apparatus)

First, an example of a configuration of a substrate processing apparatus 5 according to an embodiment of the present disclosure will be described with reference to FIG. 1. FIG. 1 shows an example of a configuration of the substrate processing apparatus 5 according to the embodiment. In the embodiment, a capacitively coupled parallel plate plasma processing apparatus will be described as an example of the substrate processing apparatus 5.

The substrate processing apparatus 5 includes a processing chamber 10 that is a cylindrical vacuum container made of a metal, e.g., aluminum, stainless steel, or the like. In the processing chamber 10, plasma processing is performed. The processing chamber 10 is grounded.

A disc-shaped mounting table 12, which serves as a substrate holding table and a lower electrode, is provided at a lower central portion in the processing chamber 10 for mounting thereon a wafer W. The mounting table 12 includes an electrostatic chuck 36 and a base 12a. The base 12a is supported by a conductive cylindrical supporting portion 16 that is made of, e.g., aluminum, and extends vertically upward from a bottom portion of the processing chamber 10, and a housing 100 adjacent to the inside thereof.

An annular gas exhaust passage 18 is formed between the conductive cylindrical supporting portion 16 and a sidewall of the processing chamber 10. An annular baffle plate 20 is attached to an upper portion or an inlet of the gas exhaust passage 18. A gas exhaust port 22 is provided at a bottom portion of the gas exhaust passage 18. In order to make the flow of the gas in the processing chamber 10 symmetrically uniform with respect to the wafer W on the mounting table 12, it is preferable to provide a plurality of gas exhaust ports 22 at equal intervals in a circumferential direction.

A gas exhaust unit 26 is connected to each of the gas exhaust ports 22 through a gas exhaust line 24. The gas exhaust unit 26 includes a vacuum pump such as a turbo molecular pump and reduces the pressure in a plasma generation space S formed between the mounting table 12 and the shower head 51 in the processing chamber 10 to a desired vacuum level. A gate valve 28 for opening and closing a loading/unloading port 27 for the wafer W is attached to the outer side of the sidewall of the processing chamber 10.

A second high frequency power supply 30 is electrically connected to the mounting table 12 through a matching unit 32 and a power supply line 34. The second high frequency power supply 30 can output a high frequency power LF having a second frequency (e.g., 13.56 MHz or the like) suitable for controlling the energy of ions attracted to the wafer W at a variable power. The matching unit 32 has a reactance-variable matching circuit for matching an impedance of the second high frequency power supply 30 side and an impedance of a load (plasma or the like) side.

The electrostatic chuck 36 for holding the wafer W by an electrostatic attractive force is provided on an upper surface of the base 12a. The electrostatic chuck 36 includes an electrode 36a made of a conductive film, and the electrode 36a is embedded between two insulating films 36b. A DC power supply 40 is electrically connected to the electrode 36a through a switch 42 and a coated line 43. The wafer W is attracted to and held on the electrostatic chuck 36 by an electrostatic force generated by a DC voltage (HV) supplied from the DC power supply 40.

An annular coolant flow path 44 extending in a circumferential direction is provided in the mounting table 12. A coolant having a predetermined temperature, e.g., cooling water cw, is supplied from a chiller unit to the coolant flow path 44 through pipes 46 and 48 and circulates therein. Accordingly, a temperature of the wafer W on the electrostatic chuck 36 is controlled by the temperature of the coolant. A heater may be provided in the mounting table 12 and may control the temperature of the wafer W with the temperature of the heater and the coolant.

A heat transfer gas (e.g., He gas or the like) from a heat transfer gas supply unit is supplied to a gap between an upper surface of the electrostatic chuck 36 and a backside of the wafer W through a gas supply line 50. The heat transfer gas has a function of improving the heat transfer efficiency between the upper surface of the electrostatic chuck 36 and the backside of the wafer W. The mounting table 12 is provided with a pusher pin that is vertically movable through the mounting table 12 to load and unload the wafer W and a lifting mechanism thereof.

A shower head 51 is provided at an opening formed at a ceiling portion of the processing chamber 10. The shower head 51 is attached to the opening formed at the ceiling portion of the processing chamber 10 via a shield ring 54 that covers an outer peripheral portion of the shower head 51, and blocks the ceiling portion. The shower head 51 may be made of aluminum or silicon. The shower head 51 also serves as an upper electrode facing the mounting table 12.

A gas inlet port 56 for introducing a gas is formed at the shower head 51. The shower head 51 has therein a diffusion space 58 extending from the gas inlet port 56. The gas supplied from a gas supply source 66 is diffused to the diffusion space 58 through the gas inlet port 56 and then introduced into the plasma generation space S through multiple gas supply holes 52.

A first high frequency power supply 57 is electrically connected to the shower head 51 through a matching unit 59 and a power supply line 60. The first high frequency power supply 57, in outputting a high frequency power HF suitable for plasma generation, can output a high frequency power HF having a first frequency that is higher (e.g., 40 MHz or the like) than the second frequency and can generate plasma by high frequency discharge at a variable power. The matching unit 59 has a reactance-variable matching circuit for matching an impedance of the first high frequency power supply 57 side and the impedance of the load (plasma or the like) side.

A control unit 74 includes, e.g., a microcomputer, and controls the operations of the respective components of the substrate processing apparatus 5 and the operation of the entire apparatus. The respective components of the substrate processing apparatus 5 include the gas exhaust unit 26, the first high frequency power supply 57, the second high frequency power supply 30, the matching units 32 and 59, the switches 42, 82 and 85, the gas supply source 66, the chiller unit, the heat transfer gas supply unit, and the like.

In the substrate processing apparatus 5, in order to perform plasma processing, e.g., etching or the like, on various types of wafers W, first, the gate valve 28 is opened and the wafer W is loaded into the processing chamber 10 through the loading/unloading port 27. The wafer W on the pusher pin is moved and mounted on the electrostatic chuck 36 by moving the pusher pin. After the gate valve 28 is closed, a predetermined gas is introduced into the processing chamber 10 from the gas supply source 66 at a predetermined flow rate and a predetermined flow rate ratio, and the gas exhaust unit 26 reduces the pressure in the processing chamber 10 to a predetermined set value. Then, the first high frequency power supply 57 is switched on to output the high frequency power HF for plasma generation at a predetermined level. The high frequency power HF for plasma generation is applied to the shower head 51 via the matching unit 59 and the power supply line 60.

On the other hand, in the case of applying the high frequency power LF for ion attraction control, the second high frequency power supply 30 is switched on to output the high frequency power LF at a predetermined level. The high frequency power LF is applied to the mounting table 12 via the matching unit 32 and the power supply line 34. A heat transfer gas is supplied to a gap between the upper surface of the electrostatic chuck 36 and the backside of the wafer W, and the switch 42 is switched on to apply a DC voltage from the DC power supply 40 to the electrode 36a of the electrostatic chuck 36. The heat transfer gas is confined to the backside of the wafer W by the electrostatic attractive force.

An edge ring 38 is provided at the vicinity of the wafer W that is the outer peripheral side of the mounting table 12 to annularly surround the outer edge of the wafer W. The edge ring 38 is divided into an inner edge ring 38i, a central edge ring 38m, and an outer edge ring 38o. An electrode 83 may be buried in the outer edge ring 38o, and the DC power supply 84 may be electrically connected to the electrode 83 through the switch 85 and a coated line 86. Accordingly, a DC voltage can be applied to the outer edge ring 38o.

A DC power supply 81 may be electrically connected to the shower head 51 through the switch 82 and a coated line 87. Accordingly, a DC voltage can be applied to the shower head 51.

(Edge Ring Divided Into Three Parts)

Among the edge ring 38 divided into three parts, the inner edge ring 38i is closest to the wafer W mounted on the mounting table 12 in the processing chamber. The central edge ring 38m is provided at the outer side of the inner edge ring 38i and is vertically movable by a moving mechanism 200. The outer edge ring 38o is provided at the outer side of the central edge ring 38m.

The moving mechanism 200 vertically moves the central edge ring 38m. The moving mechanism 200 has a lift pin 102. The lift pin 102 is vertically moved via a member 104a and a bearing portion 105 by power of a piezoelectric actuator 101. Accordingly, a connecting portion 103 is vertically moved, and the central edge ring 38m connected to the connecting portion 103 is vertically moved.

(Configuration of the Edge Ring)

Next, the configuration of the edge ring 38 and its neighboring parts will be described in detail with reference to FIG. 2.

Figure 2:
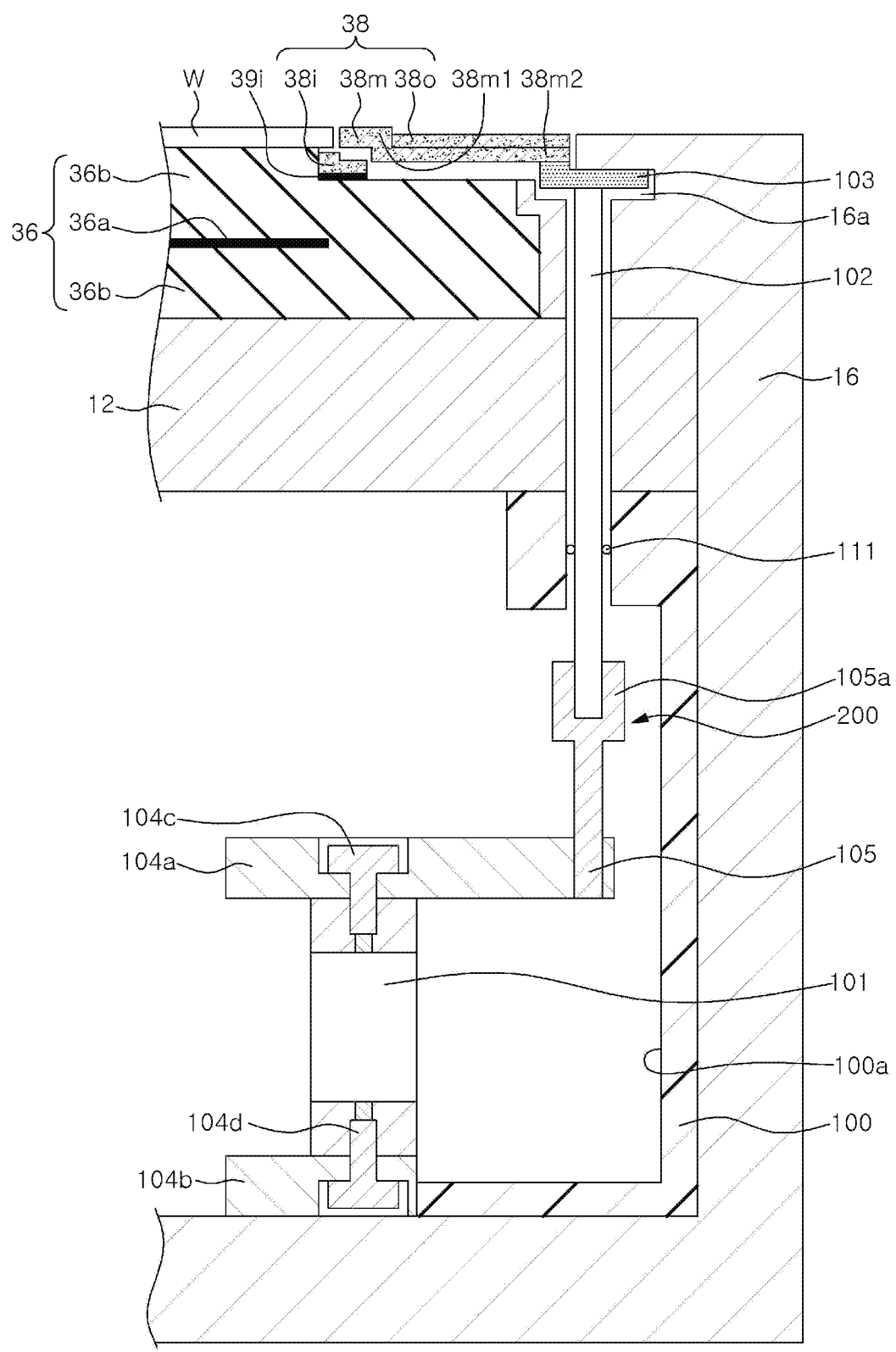
FIG. 2 shows an example of an edge ring and an example of a moving mechanism according to an embodiment.

FIG. 2 shows an example of an enlarged longitudinal cross section of the edge ring 38 and its neighboring parts. FIG. 2 shows the edge ring 38, the moving mechanism 200 and the piezoelectric actuator 101 according to an embodiment.

The inner edge ring 38i is provided near the outer periphery of the wafer W to surround the wafer W at the bottom portion of the wafer W. The inner edge ring 38i is the innermost member of the edge ring 38. The central edge ring 38m is provided at the outer side of the inner edge ring 38i to surround the inner edge ring 38i. The outer edge ring 38o is provided at the outer side of the central edge ring 38m.

The outer edge ring 38o is the outermost member of the edge ring 38. The inner edge ring 38i is fixed to the upper surface of the electrostatic chuck 36 via a heat transfer sheet 39i. The central edge ring 38m is vertically movable by the moving mechanism 200. The outer edge ring 38o is fixed to the upper surface of the electrostatic chuck 36 via a heat transfer sheet.

The central edge ring 38m has an annular portion 38m1 surrounding the peripheral portion of the wafer W and three tab portions 38m2. The tab portions 38m2 are disposed at an equal interval on the outer peripheral side of the annular portion 38m1. The tap portions 38m2 are rectangular members projecting from the outer peripheral side of the annular portion 38m1. The annular portion 38m1 and the inner edge ring 38i have an L-shaped longitudinal cross section. In a state where the step portion of the annular portion 38m1 is making contact with the step portion of the inner edge ring 38i, when the central edge ring 38m is lifted upward, the step portion of the annular portion 38m1 is separated from the step portion of the inner edge ring 38i.

(Moving Mechanism and Driving Unit)

The tab portions 38m2 of the central edge ring 38m are connected to the annular connecting portion 103.

The connecting portion 103 is vertically movable in a space 16a provided in the conductive cylindrical supporting portion 16.

The housing 100 is made of an insulator such as alumina or the like. The housing 100 has a side portion and a bottom portion disposed close to the conductive cylindrical supporting portion 16 inside the conductive cylindrical supporting portion 16. A recess 100a is formed on an inner lower side of the housing 100. A moving mechanism 200 is provided in the recess 100a of the housing 100. The moving mechanism 200 vertically moves the central edge ring 38m and includes the lift pin 102 and the bearing portion 105.

The lift pin 102 extends through a pin hole that penetrates the housing 100 and the mounting table 12. The lift pin 102 is brought into contact with a bottom surface of the connecting portion 103 in the space 16a formed in the conductive cylindrical supporting portion 16. The bearing portion 105 is fitted to the member 104a provided in the housing 100. An O-ring 111 is provided at the pin hole to separate a vacuum space and an atmospheric space.

The lower end of the lift pin 102 is fitted into a recess 105a formed at a leading end of the bearing portion 105. When the bearing portion 105 is vertically moved via the member 104a by the positioning of the piezoelectric actuator 101, the lift pin 102 is vertically moved, thereby raising or lowering the bottom surface of the connecting portion 103. Accordingly, the central edge ring 38m is vertically moved via the connecting portion 103.

The upper end of the piezoelectric actuator 101 is fixed to the member 104a by a screw 104c, and a lower end of the piezoelectric actuator 101 is fixed to a member 104b by a screw 104d. Accordingly, the piezoelectric actuator 101 is fixed to the housing 100 and interposed between the members 104a and 104b.

The piezoelectric actuator 101 is a positioning element utilizing a piezoelectric effect and can perform positioning with a resolution of about 0.006 mm (6 μm). The lift pin 102 is vertically moved depending on the vertical displacement of the piezoelectric actuator 101. Accordingly, the central edge ring 38m is moved by a predetermined height with 0.006 mm as the minimum unit.

The piezoelectric actuators 101 are provided one-to-one with the lift pins 102 in the inner space of the housing 100 positioned below the lift pins 102. In other words, three moving mechanisms 200 and three piezoelectric actuators 101 are provided one-to-one with the lift pins 102 arranged at three positions inside the housing 100. The members 104a and 104b are annular members, and vertically fasten the three piezoelectric actuators 101 with screws 104c and 104d such that the three piezoelectric actuators 101 are connected to each other by the members 104a and 104b. The piezoelectric actuator 101 is an example of a driving unit.

The lift pins 102 are provided at three locations at equal intervals in the circumferential direction of the central edge ring 38m. With this configuration, the lift pins 102 lift the central edge ring 38m upward from the three positions to a predetermined height via the annular connecting portion 103.

On a bottom surface of the outer edge ring 38o and above the tab portion 38m2 of the central edge ring 38m, a recess having a width greater than that of the tab portion 38m2 is formed. When the central edge ring 38m is moved to the uppermost position by lifting the lift pins 102 upward, the tab portions 38m2 are accommodated in the recess. This makes it possible to lift the central edge ring 38m upward while fixing the outer edge ring 38o.

As described above, in this configuration, the mounting table 12 and the electrostatic chuck 36 are supported by the housing 100, and the moving mechanism 200 and the driving unit are attached to the housing 100. Accordingly, only the central edge ring 38m can be vertically moved using the conventional electrostatic chuck 36 without design changes of the electrostatic chuck 36.

Further, in the present embodiment, a predetermined space is provided between the upper surface of the electrostatic chuck 36 and the bottom surface of the central edge ring 38m, and the central edge ring 38m can be moved not only in the upward direction but also in the downward direction. Accordingly, the central edge ring 38m can be moved not only in the upward direction but also in the downward direction within a predetermined space by a predetermined height before and during the processing of the wafer W. By moving the central edge ring 38m not only in the upward direction but also in the downward direction, the control range of the sheath can be expanded.

However, the driving unit is not limited to the piezoelectric actuator 101, and a motor capable of controlling the positioning with a resolution of about 0.006 mm may be used. In addition, there may be provided a single driving unit or a plurality of driving units. Further, the driving units may share a motor for vertically moving the pusher pins for lifting the wafer W. In that case, a mechanism for switching the power of the motor by using a gear and a power switching unit and transferring the switched power to the pusher pin for the wafer W and the lift pins 102 for the central edge ring 38m, and a mechanism for controlling the vertical movement of the lift pins 102 with the resolution of about 0.006 mm are required. Since, however, the central edge ring 38m disposed on the outer periphery of a 300 mm wafer W has a diameter of about 310 mm, it is preferable to provide a separate driving unit for each lift pin 102 as in the present embodiment.

The control unit 74 may determine the vertical displacement of the piezoelectric actuator 101 based on the consumption amount of the central edge ring 38m. The control unit 74 may determine the vertical displacement of the piezoelectric actuator 101 based on the processing conditions of the wafer processing and the cleaning process regardless of the consumption amount of the central edge ring 38m.

Further, as will be described later, in the present embodiment, the central edge ring 38m is vertically moved during the cleaning process. Accordingly, it is possible to effectively remove particles adhered to the bottom surface of the central edge ring 38m and the periphery of the central edge ring 38m.

(Positions where Particles Tend to be Accumulated)

Tests were conducted to find positions where particles tend to be accumulated in the processing chamber 10 having the edge ring 38 configured as described above. The test results will be described with reference to FIGS. 3A to 3C, showing exemplary states of particles in an embodiment and a comparative example.

Figure 3A:
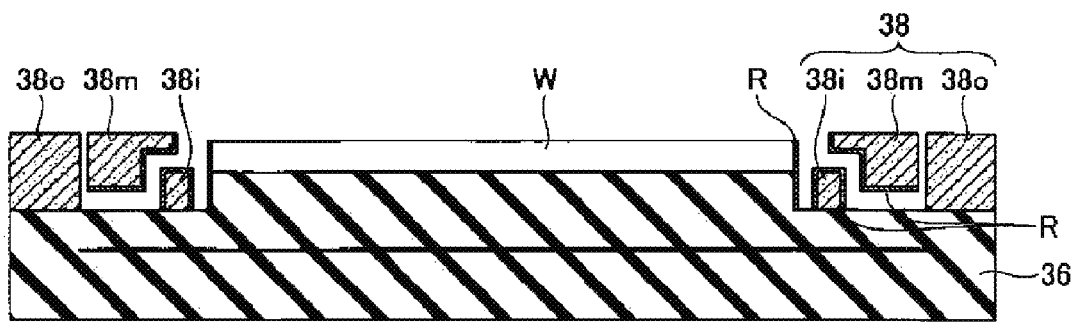
FIGS. 3A to 3C show exemplary states of particles in an embodiment.

FIG. 3A shows positions where particles tend to be accumulated in the case of performing plasma processing by vertically moving the central edge ring 38m. As indicated by R, particles tend to be accumulated on the entire surface of the inner edge ring 38i and on the inner surface and the bottom surface of the central edge ring 38m.

Figure 3B:
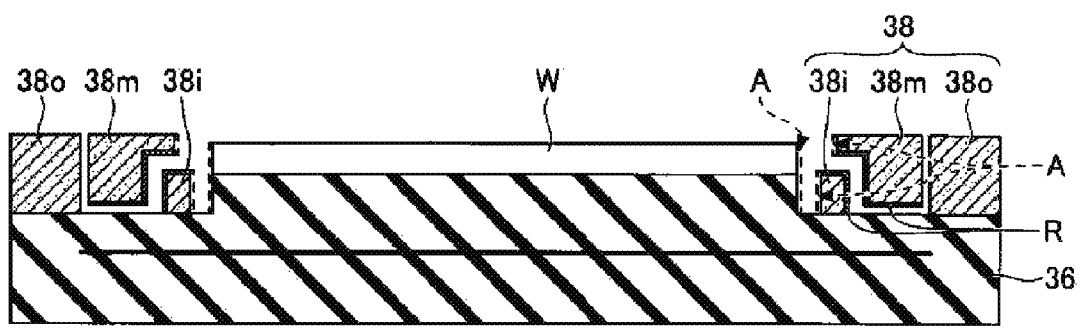
Figure 3C:
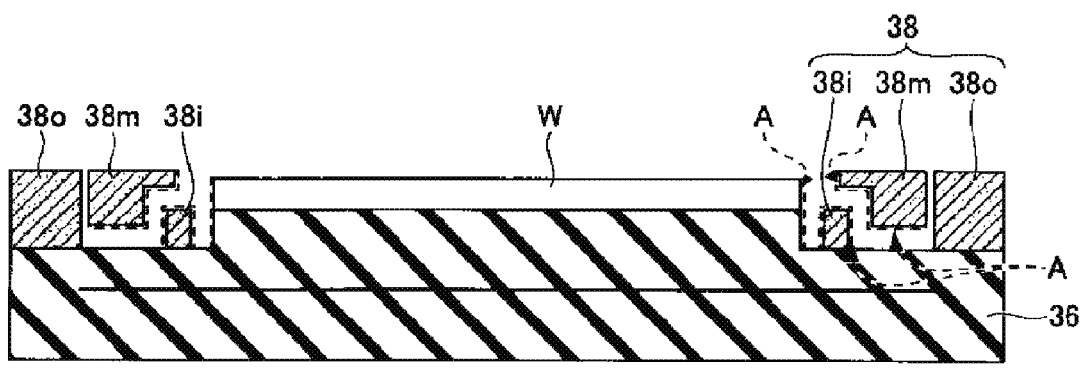

Referring to FIG. 3B, in a state where the central edge ring 38m has been lowered, a large amount of $N_2$ gas was supplied into the processing chamber 10 and the pressure was increased to generate convection. Then, a cleaning process was performed by peeling the particles adhered to the inner surface of the processing chamber by the convection and removing the peeled-off particles by viscous force of the $N_2$ gas.

As a result, it was possible to remove the particles from the outer peripheral sidewall of the wafer W indicated by A, the sidewall of the electrostatic chuck 36 below the wafer W, and the inner surfaces of the inner edge ring 38i and the central edge ring 38m. However, it was not possible to peel off the particles from the upper surface and the outer surface of the inner edge ring 38i, and the inner surface and the bottom surface of the central edge ring 38m that are close to the inner edge ring 38i, as indicated by R, which shows that the cleaning was insufficient.

(Cleaning Method 1)

A cleaning method 1 according to an embodiment will be described. In the cleaning method 1, first, a DC voltage is applied to the electrode 36a of the electrostatic chuck 36. Then, the central edge ring 38m is vertically moved. As a result, it is possible to remove the particles from all the positions where particles tend to accumulate in FIG. 3A, i.e., the outer peripheral sidewall of the wafer W, the sidewall of the electrostatic chuck 36 below the wafer W, the entire surface of the inner edge ring 38i, and the entire bottom surface of the central edge ring 38m, as indicated by A in FIG. 3C.

In the cleaning method 1, the DC voltage is applied to the electrode 36a and, thus, an electric field is generated between the edge ring 38 and the electrostatic chuck 36. If the central edge ring 38m is vertically moved in that state, a space between the central edge ring 38m, the inner edge ring 38i, and the outer edge ring 38o is changed. Accordingly, the direction or the intensity of the electric field generated in the space can be changed. In that case, the direction or the intensity of the electric field is constantly changed due to the changes in the space near the central edge ring 38m by raising or lowering the central edge ring 38m. As a consequence, particles are accumulated near the central edge ring 38m and its neighboring parts, and the cleaning effect can be enhanced. As a result, as can be seen from FIG. 3C, it is possible to peel-off and remove the particles from the bottom surface of the central edge ring 38m and its neighboring parts, which are not easily removable.

The DC voltage applied to the electrode 36a of the electrostatic chuck 36 may be a positive voltage or a negative voltage. Alternatively, a positive voltage and a negative voltage may be alternately applied. By applying a positive DC voltage, negatively charged particles are likely to be peeled off. By applying a negative DC voltage, positively charged particles are likely to be peeled off. The polarity of the DC voltage applied to the electrode 36a may be controlled depending on types of deposits adhered to the peripheral portion of the central edge ring 38m. In the case of alternately applying a positive DC voltage and a negative DC voltage, positively charged particles and negatively charged particles tend to be peeled off.

In the case of applying a DC voltage to the electrode 83 of the outer edge ring 38o and vertically moving the central edge ring 38m, the same cleaning effect as that obtained in the case of applying the DC voltage to the electrode 36a of the electrostatic chuck 36 and vertically moving the central edge ring 38m can be obtained. It is also possible to embed the electrode 83 in the inner edge ring 38i instead of the outer edge ring 38o, apply a DC voltage to the electrode 83, and vertically move the central edge ring 38m.

It is also possible to apply a DC voltage to the shower head 51 and vertically move the central edge ring 38m. In other words, the effect of the cleaning method 1 can be obtained by applying a DC voltage to at least one of the electrode 36a, the electrode 83, and the shower head 51, and vertically moving the central edge ring 38m. In a cleaning method 3 to be described below, it is possible to apply a DC voltage to at least one of the electrode 36a, the electrode 83, and the shower head 51, and vertically move the central edge ring 38m.

(Cleaning Method 2)

Next, the cleaning method 2 according to an embodiment will be described. In the cleaning method 2, first, a cleaning gas is supplied to a position below the central edge ring 38m. Then, the central edge ring 38m is vertically moved. As a result, as can be seen from FIG. 3C, it is possible to remove particles from all the surfaces of the positions where particles tend to accumulate in FIG. 3A.

In the cleaning method 2, $N_2$ gas is supplied as an example of the cleaning gas. If the central edge ring 38m is raised, the $N_2$ gas flows toward the position below the central edge ring 38m. If the central edge ring 38m is lowered in that state, the peel-off particles and the $N_2$ gas flow from the position below the central edge ring 38m toward the side surface thereof.

Therefore, in the cleaning method 2, the particles floating at the central edge ring 38m that is a movable part of the edge ring 38 and its surroundings can flow by the viscous force of the $N_2$ gas. In that case, the gas flow rate at the central edge ring 38m and its surroundings constantly changes during the cleaning by raising or lowering the central edge ring 38m. As a result, particles can be easily removed from the central edge ring 38m and its surroundings, and the cleaning effect can be further enhanced.

In the case of performing the cleaning method 2 according to the embodiment, the substrate processing apparatus 5 does not necessarily require the electrostatic chuck 36.

(Cleaning Method 3)

Finally, a cleaning method 3 according to an embodiment will be described. The cleaning method 3 according to the embodiment is combination of the cleaning methods 1 and 2 according to the embodiment.

The cleaning method 3 can provide both effects of the cleaning methods 1 and 2. For example, positive and negative charged particles can be removed using an electric field generated by the cleaning method 1, and neutral particles can be removed using a flow of $N_2$ gas supplied by the cleaning method 2. As a result, particles can be more easily removed from the central edge ring 38m and its surroundings, and the cleaning effect can be further enhanced.

In the cleaning methods 1 to 3, it is not necessary to raise and lower the central edge ring 38m. The central edge ring 38m may be either raised or lowered.

In the cleaning methods 1 to 3, the central edge ring 38m is a movable part that is vertically moved. However, the present disclosure is not limited thereto, and at least one of the inner edge ring 38i and the outer edge ring 38o may be used as a movable part that is vertically moved by the moving mechanism 200.

In the cleaning methods 2 and 3, the $N_2$ gas is purged while vertically moving the central edge ring 38m. However, the cleaning gas is not limited to $N_2$ gas, and may be an inert gas such as Ar gas, He gas or the like. At this time, it is preferable to supply a large flow rate of cleaning gas such as $N_2$ gas or the like into the processing chamber 10 and increase the pressure to generate convection, and then peel off particles adhered to the inner surface of the processing chamber 10 by the convection.

(Cleaning and Wafer Processing)

Figure 4:
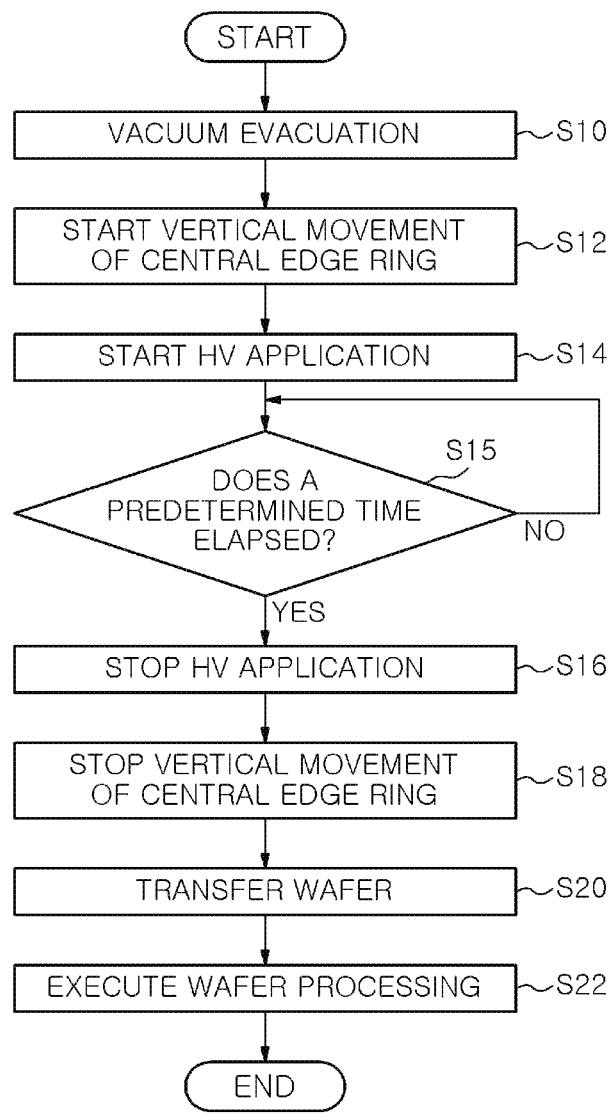
FIG. 4 is a flowchart showing an example of a cleaning process using a cleaning method 1 and wafer processing according to an embodiment.
Figure 5:
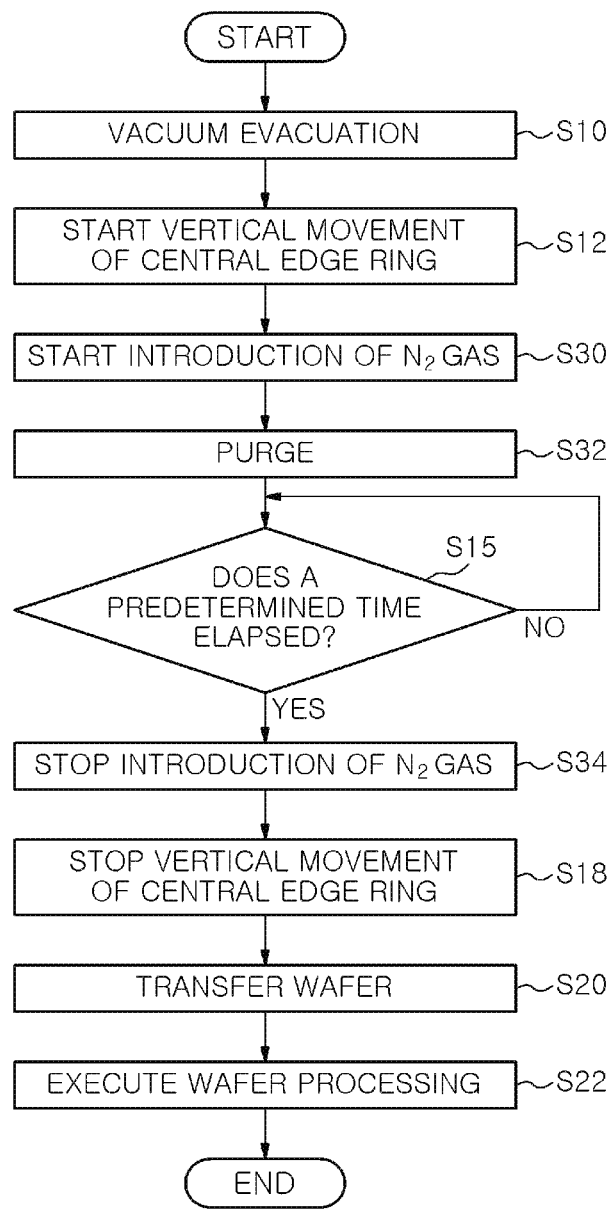
FIG. 5 is a flowchart showing an example of a cleaning process using a cleaning method 2 and wafer processing according to the embodiment.
Figure 6:
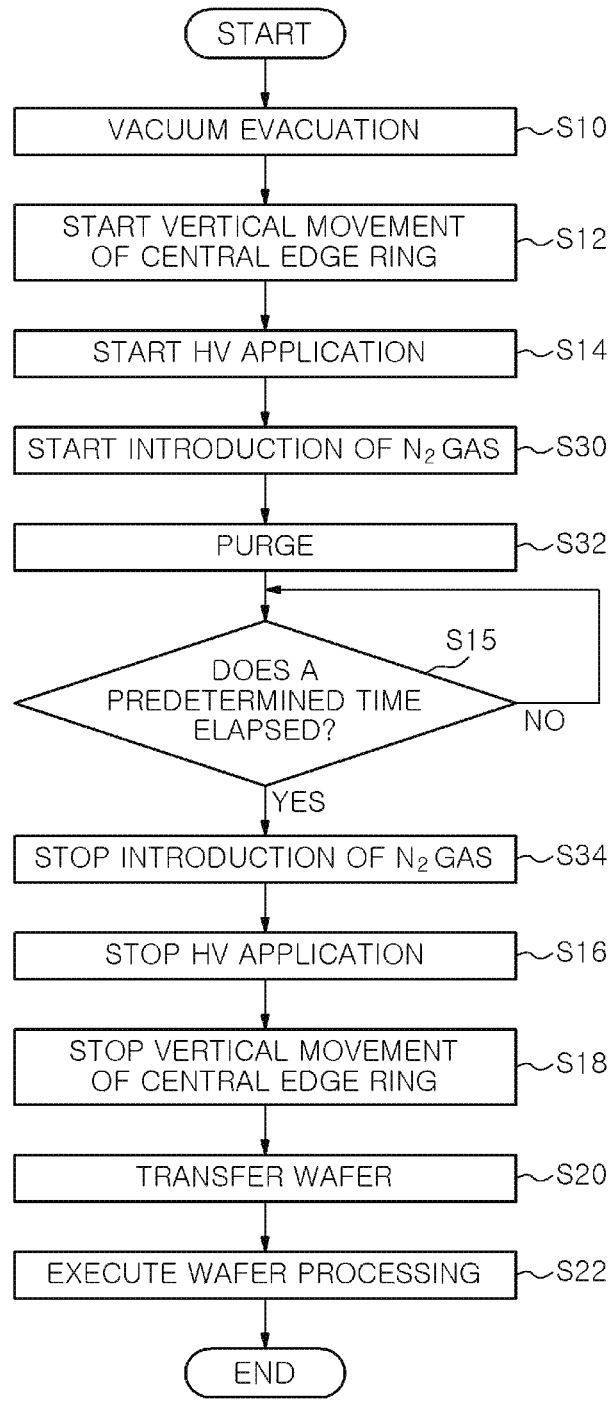
FIG. 6 is a flowchart showing an example of a cleaning process using a cleaning method 3 and wafer processing according to the embodiment.

Finally, an example of cleaning using the cleaning methods 1 to 3 and wafer processing according to the embodiment will be described with reference to FIGS. 4 to 6. FIG. 4 is a flowchart showing an example of the cleaning method 1 and wafer processing according to the embodiment. FIG. 5 is a flowchart showing an example of the cleaning method 2 and wafer processing according to the embodiment. FIG. 6 is a flowchart showing an example of the cleaning method 3 and wafer processing according to the embodiment. The processes shown in FIGS. 4 to 6 are controlled by the control unit 74. The processes shown in FIGS. 4 to 6 may be started after completion of waferless dry cleaning (WLDC), between lots, or for every wafer W.

(Cleaning Method 1 and Wafer Processing)

First, the cleaning method 1 and the wafer processing will be described. When the process shown in FIG. 4 is started, the control unit 74 evacuates the processing chamber 10 (step S10). Next, the control unit 74 starts the vertical movement of the central edge ring 38m (step S12). Next, the control unit 74 starts the application of a DC voltage (HV) to the electrode 36a of the electrostatic chuck 36 (step S14).

Next, the control unit 74 determines whether or not a predetermined time has elapsed (step S15). The control unit 74 waits until a predetermined time elapses. When it is determined that the predetermined time has elapsed, the control unit 74 stops the application of a DC voltage (HV) to the electrode 36a (step S16). Next, the control unit 74 stops the vertical movement of the central edge ring 38m (step S18).

Next, the control unit 74 loads a wafer W into the processing chamber 10 (step S20), executes predetermined processing such as etching or the like on the wafer W (step S22), and completes this processing. The processed wafer W is unloaded and the next wafer W is processed.

In the cleaning process, it is possible to change the intensity and the direction of the electric field around the central edge ring 38m by applying a DC voltage to the electrostatic chuck 36 while vertically moving the central edge ring 38m. Therefore, it is possible to remove the particles from the central edge ring 38m and its surroundings. Accordingly, the generation of particles and defects can be suppressed during the processing of the wafer W, which makes it possible to increase the yield of the wafer W and improve the productivity.

(Cleaning Method 2 and Wafer Processing)

Next, the cleaning method 2 and wafer processing will be described. When the process shown in FIG. 5 is started, the control unit 74 evacuates the processing chamber 10 (step S10).

Next, the control unit 74 starts vertical movement of the central edge ring 38m (step S12). Next, the control unit 74 starts introduction of $N_2$ gas (step S30). Next, the control unit 74 purges the $N_2$ gas using the gas exhaust unit 26 (step S32).

Next, the control unit 74 determines whether or not a predetermined time has elapsed (step S15). The control unit 74 waits until a predetermined time elapses. When it is determined that the predetermined time has elapsed, the introduction of the $N_2$ gas is stopped (step S34). Next, the control unit 74 stops the vertical movement of the central edge ring 38m (step S18).

Next, the control unit 74 loads a wafer W into the processing chamber 10 (step S20), executes predetermined processing such as etching or the like on the wafer W (step S22), and completes the processing. The processed wafer W is unloaded and the next wafer W is processed.

In the cleaning process, the particles floating at the central edge ring 38m and its surroundings can flow by the viscous force of $N_2$ gas supplied for purging while vertically moving the central edge ring 38m. Therefore, it is possible to remove the particles from the central edge ring 38m and its surroundings. Accordingly, the generation of particles and defects can be suppressed during the processing of the wafer W, which makes it possible to increase the yield of the wafer W and improve the productivity.

(Cleaning Method 3 and Wafer Processing)

Next, the cleaning method 3 and the wafer processing will be described. When the process shown in FIG. 6 is started, the control unit 74 evacuates the processing chamber 10 (step S10).

Next, the control unit 74 starts the vertical movement of the central edge ring 38m (step S12). Next, the control unit 74 starts the application of the DC voltage HV to the electrode 36a of the electrostatic chuck 36 (step S14). Next, the control unit 74 starts introduction of $N_2$ gas (step S30). Next, the control unit 74 purges the $N_2$ gas using the gas exhaust unit 26 (step S32).

Next, the control unit 74 determines whether or not a predetermined time has elapsed (step S15). The control unit 74 waits until a predetermined time elapses. When it is determined that the predetermined time has elapsed, the control unit 74 stops the introduction of the $N_2$ gas (step S34). Next, the control unit 74 stops the application of the DC voltage HV (step S16), and then stops the vertical movement of the central edge ring 38m (step S18).

Next, the control unit 74 loads a wafer W into the processing chamber 10 (step S20), executes predetermined processing such as etching or the like on the wafer W (step S22), and completes the processing. The processed wafer W is unloaded and the next wafer W is processed. In the cleaning process, the central edge ring 38m is vertically moved, $N_2$ gas is purged, and a DC voltage is applied to the electrostatic chuck 36. Accordingly, it is possible to more effectively remove the particles in the processing chamber 10, including the particles on the bottom surface of the central edge ring 38m and its surroundings.

The central edge ring 38m can be used not only for the above-described cleaning process but also for sheath control during the processing of the wafer W. Accordingly, it is possible to control the process characteristics such as the etching rate of the edge portion of the wafer W and the like.

As described above, in accordance with the cleaning process performed by the substrate processing apparatus of the present embodiment, the particles can be removed from the edge ring and its surroundings.

The cleaning method and the substrate processing apparatus according to the embodiment of the present disclosure are examples in all respects and are not limiting. The above-described embodiments can be variously changed and modified without departing from the scope and spirit of the appended claims. The contents described in the above-described embodiments may include other configurations without contradicting each other and may be combined without contradicting each other.

The substrate processing apparatus of the present disclosure can also be applied to capacitively coupled plasma (CCP), inductively coupled plasma (ICP), a radial line slot antenna, electron cyclotron resonance plasma (ECR), and helicon wave plasma (HWP).

In this specification, the wafer W was described as an example of the substrate. However, the substrate is not limited thereto and may be various substrates used for an Liquid Crystal Display (LCD), a Flat Panel Display (FPD), a CD substrate, a printed circuit board, and the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for cleaning an edge ring including an inner edge ring provided near a substrate mounted on an electrostatic chuck in a processing chamber, a central edge ring provided at an outer side of the inner edge ring and vertically movable by a moving mechanism, and an outer edge ring provided at an outer side of the central edge ring, comprising:
   applying a direct current voltage to the electrostatic chuck; and
   moving the central edge ring upward or downward while maintaining the direct current voltage applied to the electrostatic chuck, said moving the central edge ring changing a space between the central edge ring and the inner edge ring and changing a direction or an intensity of an electric field in the space to peel off particles adhered to the central edge ring and/or the inner edge ring.

2. The cleaning method of claim 1, wherein said applying the direct current voltage to the electrostatic chuck includes:
   alternately applying a positive direct current voltage and a negative direct current voltage to the electrostatic chuck.

3. The cleaning method of claim 1, wherein said applying the direct current voltage to the electrostatic chuck includes:
   controlling a polarity of the direct current voltage depending on types of deposits adhered to the central edge ring.

4. The cleaning method of claim 1, wherein at least one of the inner edge ring and the outer edge ring has an electrode, and wherein the method further comprises: applying a direct current voltage to the electrode.

5. The cleaning method of claim 1, wherein at least one of the inner edge ring and the outer edge ring has an electrode, and wherein the method further comprises: applying a direct current voltage to at least one of the electrode and a shower head provided at a position where the substrate faces.

6. The cleaning method of claim 1, wherein the inner edge ring and the outer edge ring are vertically movable, and wherein the method further comprises: moving at least one of the inner edge ring and the outer edge ring upward or downward.

7. The cleaning method of claim 1, further comprising:
   after applying the direct current voltage, determining whether or not a predetermined time has elapsed since the direct current voltage is applied to the electrostatic chuck.

8. The cleaning method of claim 1, wherein the direction or the intensity of the electric field in the space is constantly changed by moving the central edge ring upward or downward.

9. The cleaning method of claim 1, wherein a vertical displacement of the central edge ring is determined based on a consumption amount of the central edge ring.

10. The cleaning method of claim 1, further comprising:
    supplying a cleaning gas to a position below the central edge ring.

11. The cleaning method of claim 10, wherein the cleaning gas is an inert gas.

\* \* \* \* \*